(12) United States Patent
Rickert et al.

(10) Patent No.: US 7,615,256 B2
(45) Date of Patent: Nov. 10, 2009

(54) FLUIDIZED BED PROCESS FOR MIXING AND TRANSFER OF POWDERS TO CONDUCTIVE SUBSTRATES

(75) Inventors: Christoph Rickert, Reinach (CH); Jurgen Kress, Basel (CH); Michel Probst, Dietwiller (FR)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 11/575,973

(22) PCT Filed: Sep. 21, 2005

(86) PCT No.: PCT/EP2005/010216
§ 371 (c)(1),
(2), (4) Date: Jan. 24, 2008

(87) PCT Pub. No.: WO2006/034809
PCT Pub. Date: Apr. 6, 2006

(65) Prior Publication Data
US 2008/0268166 A1 Oct. 30, 2008

(30) Foreign Application Priority Data
Sep. 27, 2004 (DE) .................. 10 2004 046 744

(51) Int. Cl.
*B05D 1/04* (2006.01)
(52) U.S. Cl. ..................... 427/459; 427/475
(58) Field of Classification Search .......... None
See application file for complete search history.

(56) References Cited

U.S. PATENT DOCUMENTS

| | | | |
|---|---|---|---|
| 3,776,533 A | 12/1973 | Vlnaty | |
| 4,169,187 A | 9/1979 | Glazar | |
| 4,359,516 A * | 11/1982 | Nacci et al. | 430/109.3 |
| 4,607,091 A | 8/1986 | Schreiber | |
| 5,021,484 A | 6/1991 | Schreiber et al. | |
| 5,176,780 A | 1/1993 | Schreiber et al. | |
| 5,200,452 A | 4/1993 | Schreiber | |
| 5,407,743 A | 4/1995 | Clough et al. | |
| 5,672,214 A | 9/1997 | Arthur et al. | |
| 5,718,039 A | 2/1998 | Saida | |
| 6,187,416 B1 | 2/2001 | Satoh et al. | |
| 6,280,798 B1 | 8/2001 | Ring et al. | |
| 6,342,273 B1 * | 1/2002 | Handels et al. | 427/475 |
| 7,041,772 B2 | 5/2006 | Aizawa | |
| 7,064,483 B2 * | 6/2006 | Ottermann et al. | 313/504 |

(Continued)

FOREIGN PATENT DOCUMENTS

AU 77213 91 11/1991

(Continued)

OTHER PUBLICATIONS

Pieter Gillis De Lange, Powder Coatings-Chemistry and Technology, 2nd Edition, 2004, pp. 340-360, Vincent Network, Hannover.

(Continued)

*Primary Examiner*—Frederick J Parker
(74) *Attorney, Agent, or Firm*—McDonnell Boehnen Hulbert & Berghoff LLP

(57) ABSTRACT

Disclosed is a process for mixing and gentle transport and transfer of powders to substrates.

17 Claims, 2 Drawing Sheets

U.S. PATENT DOCUMENTS

2006/0008632 A1    1/2006    Oohori et al.

FOREIGN PATENT DOCUMENTS

| | | |
|---|---|---|
| DE | 698 07 934 | 5/2003 |
| EP | 0 178 414 | 4/1986 |
| EP | 0 356 379 | 2/1990 |
| EP | 0 458 740 | 11/1991 |
| EP | 0458 739 | 11/1991 |
| EP | 0 493 310 | 7/1992 |
| EP | 0 323 563 | 10/1993 |
| EP | 1 321 197 | 6/2003 |
| EP | 1 108 532 | 5/2006 |
| GB | 1 203 813 | 9/1970 |
| JP | 1999-307512 | 5/2001 |
| JP | 1999-310113 | 5/2001 |
| JP | 1999-373382 | 7/2001 |
| JP | 2000-123496 | 10/2001 |
| JP | 2000-231515 | 2/2002 |
| JP | 2000-255897 | 3/2002 |
| JP | 2000-358678 | 6/2002 |
| JP | 2001-48536 | 9/2002 |
| WO | 96/15199 | 5/1996 |
| WO | 02/055603 | 7/2002 |
| WO | 02/072655 | 9/2002 |

OTHER PUBLICATIONS

Clayton A. May, Epoxy Resins: Chemistry and Technology, 2nd Edition, 1988, pp. 213-230 and 492-498, Marcel Dekker, New York.

H. Schreiber, W. Saur, New Fire Retardand Halogen Free Polymers, Macromolecular Chemistry, Macromolecular Symposia, 1993, pp. 165-171, 74, Huthig & Wepf Verlag, Basel.

Shiow-Ching Lin, Eli M. Pearce, Carl Hanser Verlag, High-Performance Thermosets, chapter 2, 1994, pp. 13-63, Munich.

Brian Oregan & Michael Gratzel, A Low-Cost, High-Efficiency Solar Cell Based on Dye-Sensitized Colloidal TiO2 Films, Letters To Nature, 1991, pp. 737-740, 24, Oct. 24, 1991.

\* cited by examiner

FLUIDIZED BED PROCESS FOR MIXING AND TRANSFER OF POWDERS TO CONDUCTIVE SUBSTRATES

This application is a national phase application under 35 U.S.C. 371 of International Application No. PCT/EP2005/010216, filed Sep. 21, 2005, which claims priority to DE 10 2004 046 744.7, filed Sep. 27, 2004, the contents of which are hereby incorporated by reference.

The present invention relates to a process for the gentle transfer of powders to substrates and, in particular, for the transfer to conductive substrates such as metal sheets, conductive polymers, metal coated polymers, coated glass such as ITO (indium tin oxide) glass for use in the preparation of printed circuit boards and solar cells.

The formation of layers having a different thickness plays an important role in the production of printed circuit boards. Thus, for example, copper foils are coated with epoxy resin compositions dissolved in solvents and subsequently the solvent is evaporated. The sheets obtained thereby are then laminated under pressure on already pre-structured so-called inner layers under vacuum (U.S. Pat. No. 5,718,039, U.S. Pat. No. 6,187,416, EP 1 108 532 A1). A further example is the application of a solder stop mask on the final printed circuit board. The corresponding compositions also contain solvents which need to be removed by heat (EP 0 323 563 A2).

The solvent-based processes are disadvantageous in that they require a large amount of energy to evaporate the solvent, they are harmful to the environment, they require sophisticated industrial hygiene, the solvents are combustible, waste disposal is complicated and entails additional considerable costs.

As an alternative, processes are available wherein powder formulations are used. Powder spraying, powder cloud and electromagnetic brush methods (Pieter Gillis de Lange, Powder Coatings-Chemistry and Technology, 2nd edition, Vincentz Network, Hanover 2004) are described in the literature. The two first mentioned possibilities are used on an industrial scale in the paint industry. However, they cannot be used in the field of printed circuit boards in view of the non-uniform layer thickness which is obtained by these processes.

Using the so-called electromagnetic brush, powder coatings and powder coating particles, respectively, are transferred to conductive or discharging substrates by means of magnetic brushes. These processes are based on the same principle which is also applied with laser printers and copying machines. The powder to be applied is mixed in a tank or container, respectively, with the carrier particles, i.e., the so-called carriers. These consist of a magnetic core having a plastic coating.

By means of mechanic mixing using several rolls, the powder is charged electrostatically and thus adheres to the carriers. The mixing rolls continuously transport the powder with the carriers to the so-called brush roll having magnets in its interior. The magnetic carrier particles together with the powder adhering thereto now stick to the roll. If a corresponding voltage is applied between the brush roll and the substrate drum, the powder particles are transferred to the substrate (for example, a metal sheet), whereas the carrier particles remain in the system.

BRIEF DESCRIPTION OF THE DRAWINGS

FIG. 1 further shows a heating means (7) for melting the powder coating and for sintering the powder, respectively. (4) denotes a metal plate or sheet stripping off the carriers so that they are transferred back into the container. Finally, (8) denotes a roll for winding up the coated substrate.

Figure 1:
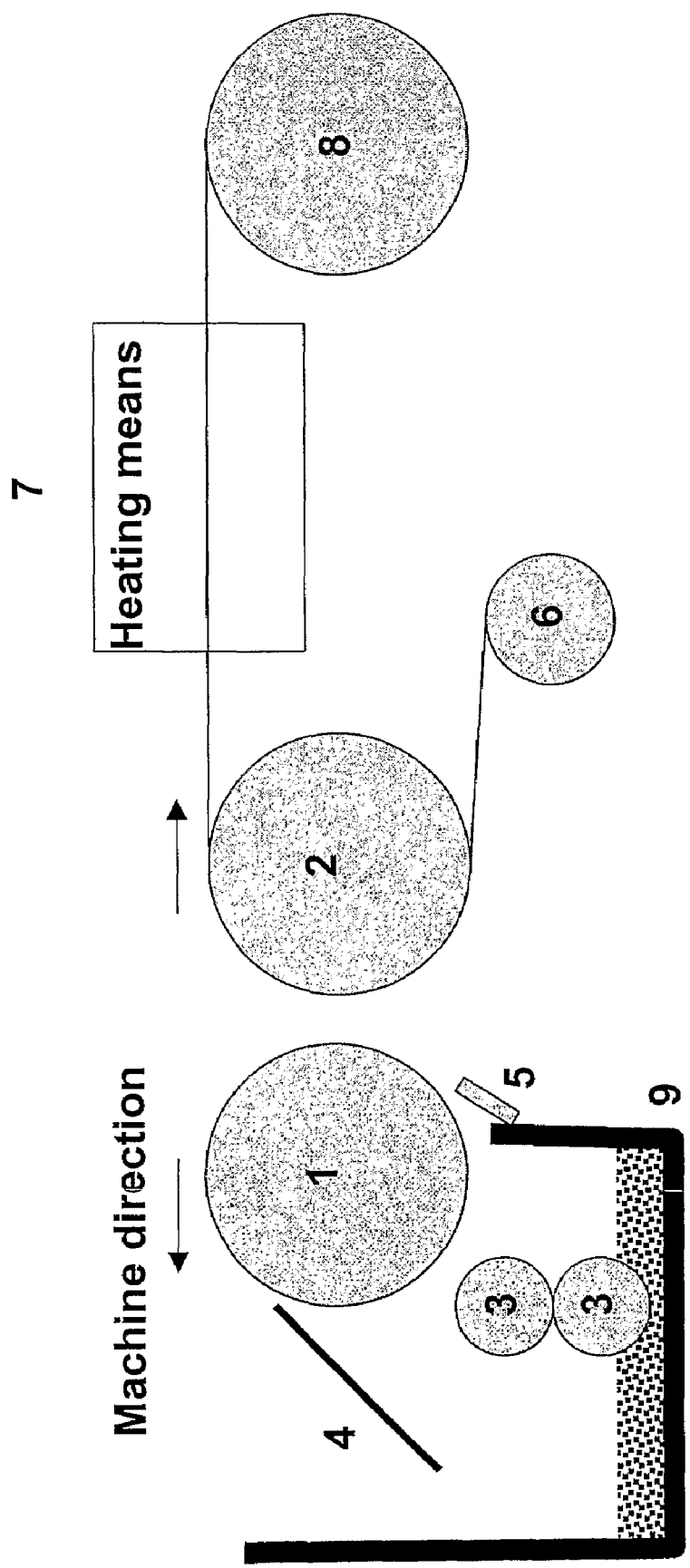
FIG. 1 schematically describes a coating unit having mixing drums. The carrier and power are mixed in the container (10). Thereby the powder is charged and adheres to the oppositely charged carriers. The transport to the brush drum (1) is made by the mixing rolls (4). The mixing rolls or mixing drums, respectively, may have magnets in their interior. Alternatively, they have wings or paddles on the outside. These serve to mix the carriers and the powder or powder coating, respectively. The mixing rolls transport the particles to the brush drum (1). The brush drum has magnets in its interior. By applying a voltage between the brush drum (1) and the substrate drum (2), the positively charged powder particles are repelled and are transferred to the grounded substrate (6) which is on the substrate drum (2). The substrate (for example, a copper sheet) is unreeled from a roll (6). The substrate must be a discharging substrate.
Figure 2:
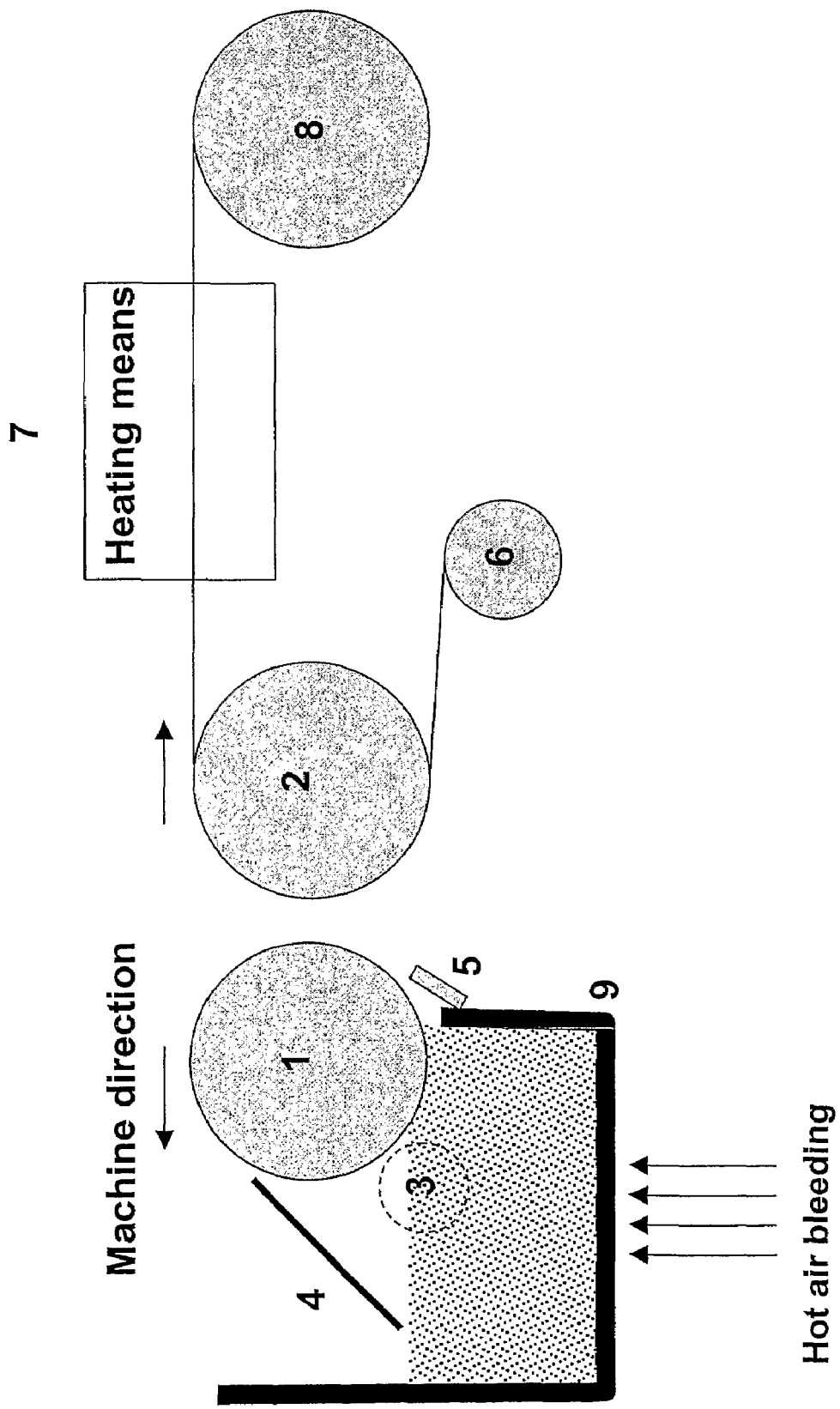
FIG. 2 shows a modification comprising a fluidized bed: The mixing rolls (3) shown in FIG. 1 are replaced with a fluidized bed (represented in FIG. 2 by dots). The fluidized bed is generated by blowing air into the mixture of carriers and the powder or powder coating, respectively, which fluidized bed mixes and thus causes an opposite electrostatic charge of the carriers and the powder. In addition, the transport to the brush drum is made.

In this way, a substrate can be coated continuously with layers having a uniform thickness. The distribution of the thickness of the layers is ±15%, preferably ±10% and most preferably ±5%.

A layer thickness in the range of 5 to 100 µm can be obtained by the process according to the present invention.

Therein, the substrate is coated with the powder to be applied continuously and at the same time new powder is added from the outside. The carriers remain in the system. Mixing is done according to the state of the art mechanically by rolls. This mixing also serves to charge the powder by friction which thus adheres to the carriers. The transfer to the first roll is done by bladed wheels or magnetic rolls which are immersed in the mixture. The mixture is very compact having the following consequences:

a) The drive motor must have a high power
b) resulting in a high mechanic strain on the carriers
c) which rapidly destroys the thin coating of the carrier resulting in a decreased charging and therefore to a decreased lifetime.
d) It is difficult to start the device which is frequently blocked since the heavy mixture prevents the rolls from rotating.

A further problem is the lifetime of the carrier particles. On account of the mechanic stress or strain caused by the mixing rolls and on account of the voltage between the brush drum and the substrate drum, the carriers deteriorate over time so that they have to be replaced. This causes additional costs on the one hand because new carrier material needs to be purchased and on the other hand because the device needs to be stopped resulting in a substantial decrease of its operating time.

It is the object of the invention to provide a process for the gentle transport of powder mixtures in such coating devices and, hence, for the transfer of powder and powder coatings to substrates, particularly conductive substrates such as metal sheets.

This object is achieved by a process for the mixing and gentle transport and the transfer of powders to substrates wherein the powder particles are first charged by friction in the presence of magnetic particles and then transported by means of a fluidized bed and optionally one or more mixing rolls and then transferred and applied to a substrate by means of an electric field between a brush drum and a substrate drum carrying said substrate, characterized in that the mixing and the transport of the powder particles and the magnetic particles are carried out by means of a boiling bed.

Boiling bed processes per se are known to the skilled person. They are based on the following principle:

When gases flow from beneath horizontal, porous plates through small size particles, a state is achieved under certain flow conditions resembling a boiling fluid; bubbling occurs within the layer and the particles therein are in a constant turbulent movement upwards and downwards and are like in a floating condition. Therefore it is called a boiling bed, turbulent bed, fluidized bed (as opposed to a fixed bed) or fluid bed or fluidizing. The boiling bed is formed when a certain upper limit of the speed of the gas flowing upward is achieved (incipient fluidizing velocity). The point at which the static or stationary layer turns into a turbulent layer and the fixed bed into a boiling bed is called the incipient fluidizing point or whirl point. Basically at the whirl point the gravitational force acting on the solid particles is compensated by the resisting force caused by the fluid motion. Exactly when this point is reached depends on a number of physical factors such as, for example, the density, the size, the distribution and form of the particles, the properties of the fluidizing agent and the design of the device.

The air-permeable plates for the generation of the fluidized bed are commercially available, for example, under the trade names SINTERPOR or CONIDUR.

Like a liquid, the boiling bed can flow out through openings or orifices, it can be transported through pipes, flow off from an inclined plane, for example, a conveyor chute, etc.

The process according to the invention makes use of this concept. The aforementioned carrier particles or carriers, respectively, are mixed with the powder particles in a boiling bed. Thereby the following surprising advantageous effects are achieved:
a) Rapid distribution of the fresh powder.
b) Rapid charging caused by the high dynamic of the boiling bed.
c) The powder or the powder coating, respectively, can directly be incorporated into the boiling bed in spite of its low density and is not blown upwards by the high pressure.
d) Less mechanical strain on mixing rolls which may optionally be present and on the brush drum (the mixture flows like a fluid).
e) (Most of) the conveyor rolls can be dispensed with.
f) Once the turbulent mixing (fluidizing) is stopped, the volume of the mixture decreases by one third. Thus, the brush drum is no longer immersed in the mixture of carrier particles/powder. When the device starts to operate again, the rolls or drums (the brush drum, for example) can be made moving without exerting high force.

The process according to the present invention is further based on the surprising finding that the brush drum can take up, during a short period in the boiling bed, an amount of carrier/powder particles sufficient to obtain the desired layer thickness on the substrate, although the density of the mixture of powder and carrier particles is reduced by blowing air into the mixture which is necessary to form the boiling bed.

The process according to the present invention results in a longer lifetime of the carrier particles. In addition, more homogeneous layers, in particular in horizontal direction, are achieved on the substrate to be coated by a uniform distribution of the continuously added powder. This is an essential advantage when compared to the state of the art processes wherein mixing drums are used which transport the powder only vertically in the direction of the brush drum.

Altogether, the process according to the present invention can be carried out using devices having fewer mechanically operated parts so that these cannot be blocked or clogged.

By the disposal of the mixing rolls the entire system can be modified without a cumbersome adjustment of the mechanics of the mixing drums (for example, a larger tank in combination with a larger brush drum, etc.).

The process according to the present invention is preferably used in the preparation of resin coated copper sheets for the production of printed circuit boards. In general, it can be used for supplying mixtures of powder particles and carrier particles to the brush roll in electrographic devices. In particular, the process according to the present invention can be used for 2K toner systems wherein the powder can be made up depending on its consumption.

Further, the process according to the present invention is preferably used in the preparation of resin coated copper sheets for the production of printed circuit boards.

The size of the powder coating particles used in the process according to the pre-sent invention is in general <150 μm and preferably <100 μm and most preferably <50 μm.

The size of the carrier particles is in general 10-150 μm and preferably 20-100 μm.

In the process according to the present invention a curable powder coating is preferably used which comprises particles obtainable by
(i) mixing
   (a) a polymeric binder, an oxazine resin, a cyanate ester or a maleimide,
   (b) a hardener or initiator,
   (c) a coating additive,
   (d) optionally a filler,
   (e) optionally a compatibilizing polymer and optionally further components
(ii) melt extruding the mixture obtained in step (i) and
(iii) milling and sieving the extruded mixture.

According to a preferred embodiment of the invention, the powder coating has a glass transition temperature in the uncured state of at least 20° C., preferably at least 25° C. and more preferably at least 30° C. and has a glass transition temperature in the cured state of at least 150° C., preferably at least 160° C. and more preferably at least 170° C., as measured by DSC.

It is preferred, for the further processing of the substrate coated by the process according to the present invention, that the degree of curing (as measured by DSC) ranges from 1-70% and preferably 10-50%.

Furthermore, the polymeric binder is preferably essentially an epoxy resin which is solid at room temperature. The glass transition temperature of the resin should preferably be at least 25° C.

The powder coating used in the invention can preferably also comprise a mixture of epoxy resins. This mixture preferably has a glass transition temperature of >25° C. in the uncured state. Its molecular weight (number average molecular weight) is generally >600.

Suitable epoxy resins for the preparation of the powder coating used in the invention are described, for example, in: Clayton A. May (Ed.) Epoxy Resins: Chemistry and Technology, 2nd ed., Marcel Dekker Inc., New York, 1988.

Preferred mixtures of epoxy resins on the basis of bisphenol A and bisphenol A diglycidyl ether. The epoxy equivalent weight of these resins is >300 g/equivalent. Such a resin is, for example, D.E.R. 6508 (available from Dow Chemicals).

Epoxy resins on the basis of bisphenol F and bisphenol S can optionally also be added.

Furthermore, the mixture can comprise multifunctional epoxy resins. The functionality of these resins is >3. Examples for such multifunctional epoxy resins are cresol-novolak epoxy, phenol-novolak epoxy and naphthol-containing multifunctional epoxy resins.

Examples for the aforementioned epoxy resins are bisphenol A epoxy resin such as D.E.R. 667-20, D.E.R. 663UE, D.E.R. 692H, D.E.R. 692, D.E.R. 662E, D.E.R. 6508, D.E.R. 642U-20 (available from Dow Chemicals), cresol-novolak epoxy resins such as Araldite ECN 1299, Araldite ECN 1280 (Vantico), EOCN-103 S, EOCN-104, NC-3000, EPPN 201, EPPN-502H (Nippon Kayaku), naphthol epoxy resins such as NC 7000-L (Nippon Kayaku) and brominated Epoxy resins such as Araldite 8010 (Vantico), BREN-S (Nippon Kayaku), ESB-400 T (Sumitomo) and Epikote 5051 (Resolution). Moreover, modified epoxy resins can also be used. Such modifications are, for example, the use of chain reaction terminating agents to control the molecular weight, so-called "high-flow" resins, and the use of multifunctional monomers to prepare branched resins.

A particularly preferred powder coating used in the invention comprises, as component (a), about 50-90 wt.-% of epoxide and about 5-20 wt.-% of cyanate ester, as component (b), about 0.5-5 wt.-% of dicyandiamide and about 0.1-2 wt.-% of 2-phenylimidazole, for example about 85 wt.-% of epoxide, 10 wt.-% of cyanate ester, about 2 wt.-% of dicyandiamide as hardener and about 1 wt.-% of 2-phenylimidazole as initiator.

As mentioned above, apart from the epoxy resins, cyanate esters can also be used as polymeric binders. In the preparation of the powder coating used in the invention, these can be used both in monomeric form as well as in the form of oligomers or prepolymers.

Suitable cyanate esters are bifunctional cyanate esters, such as BADCy, Primaset Fluorocy, Primaset MethylCy, or multifunctional cyanate esters, such as Primaset BA-200, Primaset PT 60, Primaset CT 90, Primaset PT 30. All of the aforementioned bifunctional and multifunctional cyanate esters are available from Lonza, Basel, Switzerland.

Especially preferred cyanate esters are BADCy and its prepolymers (e.g. Primaset BA-200).

Apart form the cyanate esters, the component (a) can also comprise 1-oxa-3-aza-tetralin-containing compounds (oxazine resins). In the preparation of the powder coating used in the invention, these are also initially employed in monomeric form.

Preferred oxazine resins are those which are obtained either by reacting bisphenol A with aniline and formaldehyde or by reacting 4,4'-diaminodiphenyl methane with phenol and formaldehyde. Further examples may be found in WO 02/072655 and EP 0 493 310 A1 as well as in WO 02/055603 and the Japanese patent applications JP 2001-48536, JP 2000-358678, JP 2000-255897, JP 2000-231515, JP 2000-123496, JP 1999-373382, JP 1999-310113 and JP 1999-307512. Further examples may be found in Macromolecular Chemistry, Macromolecular Symposia (1993), 74 (4th Meeting on Fire Retardant Polymers, 1992), 165-71, EP 0 493 310 A1, EP 0 458 740 A1, EP 0 458 739 A2, EP 0 356 379 A1 and EP 0 178 414 A1.

The maleimides used in the preparation of the powder coating of the invention are also known per se to the skilled person and are described, for example, in Shiow-Ching Lin, Eli M. Pearce, High-Performance Thermosets, Carl Hanser Verlag, Munich 1994, Chapter 2.

The component (b) of the resin composition used in the invention comprises a hardener or initiator. Such hardeners and initiators are known per se to the skilled person and comprise latent hardeners with low activity at room temperature, such as phenolic hardeners, such as D.E.H. 90, D.E.H. 87, D.E.H. 85, D.E.H. 84, D.E.H. 82 (available from Dow Chemicals, US), dicyandiamide or derivatives thereof, such as Dyhard OTB, Dyhard UR 200, Dyhard UR 300, Dyhard UR 500, Dyhard 100, Dyhard 100 S, Dyhard 100 SF and Dyhard 100 SH (available from Degussa, Germany), bisphenol A, acid anhydrides, such as phthalic acid anhydride, tetrahydrophthalic acid anhydride, trimellitic acid anhydride, pyromellitic acid anhydride, hexahydrophthalic acid anhydride, HET-acid anhydride, dodecenyl succinic acid anhydride, bicyclo[2.2.1]hept-5-en-2,3-dicarboxylic acid anhydride, aromatic and aliphatic amines, such as diaminodiphenylsulfone, diaminodiphenylether, diaminodiphenylmethane or ring-substituted dianilines, such as Lonzacure® M-DEA, Lonzacure® M-DIPA, Lonzacure® M-MIPA, Lonzacure® DETDA 80 (all of the aforementioned compounds are available from Lonza, Basel, Switzerland).

Preferably, dicyandiamide or modified dicyandiamide is employed.

In the resin composition used in the invention, the hardeners or initiators are used in an amount of below 10 wt.-%, preferably below 5 wt.-% (lower limit: about 0.1 wt.-%).

Preferred initiators are imidazoles and derivatives thereof, such as 2-methylimidazole, 2-ethyl-4-methylimidazole, 2-phenylimidazole, 2-phenyl-4-methylimidazole, bis(2-ethyl-4-methylimidazole), 2-undecylimidazole, 2,4-diamino-6(2'-methyl-imidazole(1'))ethyl-s-triazine and 1-cyanoethyl-2-undecylimidazole. Furthermore salts formed from imidazoles and carboxylic acids can be used. Further initiators are 1,8-diaza-bicyclo(5.4.0)undecene (DBU) and borontrihalide-amine complexes, such as BF3-amine. Further examples may be found in Clayton A. May (Ed.) Epoxy Resins: Chemistry and Technology, 2nd ed., Marcel Dekker Inc., New York, 1988.

The resin composition used in the invention further comprises coating additives as component (c). These comprise flow-control agents, degassing agents and lubricants. These are known per se to the skilled person. Typical examples are butyl acrylate polymers as flow-control agents, benzoin as degassing agents and waxes as lubricants. Furthermore, for example stabilizers can be used as coating additives.

The resin composition used in the invention contains the coating additives in an amount of generally 0.1-10 wt.-%, preferably 0.2-5 wt.-%.

Coating additives also comprise adhesion promoters. These are useful for providing adhesion to the copper substrate.

The powder coating used in the invention may further comprise organic and inorganic fillers (d).

These fillers are suitably employed in the powder coating used in the invention in an amount of 5 to 300 wt.-%, preferably 10 to 200 wt.-%, more preferably 10 to 100 wt.-%. The stated amounts relate to the sum of components (a), (b) and (c) of the powder coating.

Examples for organic fillers are fluorine containing polymers, such as polytetrafluoroethylene (PTFE), tetrafluoroethylene/hexafluoropropylene copolymer (FEP), tetrafluoroethylene/ethylene copolymer (E/TFE), tetrafluoroethylene/hexafluoropropylene/vinylidene fluoride terpolymer (THV), poly(trifluorochloroethylene) (PCTFE), trifluorochloroethylene/ethylene copolymer (E/CTFE), poly(vinyl fluoride) (PVF), poly(vinylidene fluoride) (PVDF), perfluoroalkoxy copolymer (PFA), tetrafluoroethylene/perfluoromethylvinylether copolymer (MFA), furthermore poly(vinyl chloride) (PVC), polyphenyl ether (PPO), polysulfone (PSU), polyaryl ether sulfon (PES), polyphenyl ether sulfon (PPSU), polyphenylene sulfide (PPS), polyether ketone (PEK) and polyether imide (PEI).

Especially preferred organic fillers are tetrafluoroethylene/hexafluoropropylene copolymer (FEP), ethylenetetrafluoroethylene copolymer (ETFE) and polyphenyl ether (PPO).

In the powder coating used in the invention, there may preferably be used organic fillers which do not melt upon processing. Alternatively, there can be used fillers which melt and show phase separation upon cooling.

Apart from the organic fillers, inorganic fillers may also be used in the powder coating.

Such fillers are, for example, fused silica, such as Silbond 800 EST, Silbond 800 AST, Silbond 800 TST, Silbond 800 VST, Silbond 600 EST, Silbond 600 AST, Silbond 600 TST, Silbond 600 VST (available from Quarzwerke Frechen, Germany), fumed silica, such as Aerosil 300 and Aerosil R 972, precipitated silica, such as Ultrasil 360, Sipernat D 10, Sipernat 320 (available from Degussa, Germany), calcined kaolin, such as PoleStar (Imerys, St Austell, UK), Santintone (Engelhard Corporation, Iselin, N.J., US), aluminium oxide, magnesium oxide, zirconium oxide, aluminium silicates, calcium carbonate and barium sulfate, silica glass and kaolin being preferred fillers. Furthermore, there may be mentioned ceramics, especially those with low or negative coefficients of expansion.

The advantages of the powder coating used in the invention are that it is possible, in order to optimise the properties of the product, to select from a variety of fillers the one which best satisfies the relevant requirements. For example, a given epoxy resin mixture can, thus, be modified as needed. Even fillers which are difficult to process can be incorporated without problems. Thus, electric properties such as the dielectric constant ($D_k$), the dielectric loss factor (tan δ), the breakdown resistance, the surface resistance, the volume resistance and mechanical properties such as bending strength, impact strength, tensile strength as well as further material properties such as the coefficient of thermal expansion (CTE), flammability and others can be adapted as desired. The filler does not have to be solvable or stably dispersable in organic solvents. Consequently, it is possible to use materials as fillers which could previously not or only hardly be used in sequential build-up (SBU), such as the aforementioned organic fillers.

The electrical and mechanical properties of the powder coating and of the coating layer prepared therefrom can be influenced and controlled by the fillers.

Thus, for example fillers with a low dielectric constant, such as PTFE, FEP and kaolin may be employed in order to prepare coating layers with a correspondingly low dielectric constant.

Further electrical properties can be controlled in an analogous way.

The mechanical properties which can be influenced by the fillers comprise, in particular, properties such as the coefficient of thermal expansion, impact strength, and tensile strength.

The following fillers are particularly suitable for controlling the coefficient of thermal expansion: silica glass, kaolin, calcium carbonate and ceramics with a negative coefficient of expansion.

Bending strength can be influenced or controlled, for example, by PPO.

According to a preferred embodiment of the invention, the cured powder coating has a coefficient of thermal expansion (CTE) of <70 ppm/° C. and preferably <60 ppm/° C. in the x-, y- and z-direction.

According to a further preferred embodiment, the dielectric constant of the coating in the cured state is <3.8, preferably <3.6. Moreover, glass transition temperatures of the cured formulation of above 150° C., preferably above 160° C., are preferred.

Furthermore, flame-retardant materials may be used as fillers. Examples for these are inorganic materials which release water upon heating, such as aluminium hydroxide, which is available, for example, as Martinal OL-104, Martinal OL-111 (Martinswerk GmbH, Bergheim, Germany) or Apyral 60 D (Nabaltec, Schwandorf, Germany), magnesium hydroxide, available, for example, as magnesium hydroxide 8814 (Martinswek GmbH, Bergheim, Germany) or Mg-hydroxide SIM 2.2 (Scheruhn Industrie-Mineralien, H of, Germany), phosphorous-containing organic compounds, such as triphenyl phosphate (TPP), tricresyl phosphate (TCP), cresyl diphenyl phosphate (CDP), tertiary phosphin oxides, such as Cyagard® and Reoflam® 410, red phosphorous in the form of a dispersion in an epoxy resin, such as Exolit RP 650, or in the form of a powder, such as Exolit OP 930 (both products are available from Clariant GmbH, Frankfurt, Germany) and antimony trioxide.

Furthermore, the flammability of the powder coating of the invention can be influenced and controlled by component (c), i.e., the coating additives. In this connection, for example, phosphorous-containing and nitrogen-containing flame retardants may be mentioned.

The powder coating of the invention can, optionally, further contain compatibilizing polymers. Such compatibilizing polymers are, for example, di- or triblock copolymers such as styrene/butadiene/styrene or styrene/butadiene/methyl methacrylate blockcopolymers (Atofina, France).

Furthermore, the powder coating used in the invention can contain conventional additives which are conventionally used in the processing of epoxy resins.

In the preparation of the powder coating used in the invention, the components (a), (b), (c) and, optionally, (d) and (e) are first dry-milled to give a powder.

In doing so, it may be useful to mix and extrude individual components beforehand to prepare a master batch.

This procedure must be used, in particular, when certain components are difficult to incorporate. These are then incorporated into each other beforehand. Such master batches are also commercially available. For example, in the case of the resins, for example, it is possible to mix two resins beforehand. This course of action is used, in particular, when one of the resins has a low glass transition temperature. Moreover, this procedure may be used when certain components are used only in small amounts.

The aforementioned components or master batches are premixed and milled in the dry state. Before milling, the mixture may optionally be cooled.

After thorough mixing (and optional cooling), the material is milled in the dry state while maintaining a powder and the powder is subsequently extruded. This extrusion provides complete homogenisation of the components and is a key step in the overall process.

After extrusion, the material is milled in the dry state and the oversize material is separated, wherein a sieve size in the range of less than 10 to 500 µm and preferably less than 100 µm is suitably used, which guarantees a corresponding particle size. Classifying mills such as Hosekawa MicroPul are particularly suitable for milling.

The aforementioned melt extrusion is preferably carried out in such a way that the conversion of the reactive component is less than 20%, preferably less than 10%. This reaction is due to the fact that a melt is formed upon extrusion. The degree of conversion can be determined by the skilled person by thermal analysis. The corresponding extrusion parameters (for obtaining such a degree of conversion) can be determined by the skilled person by simple experiments. They depend on the type of extruder and the type and amount of the components employed. For example, a Buss co-kneader can be used as extruder, in which the aforementioned components are extruded. As mentioned above, the mass is subsequently cooled and reduced to small pieces. The final powder coating mixtures preferably have an average particle size in the range of 1 to 500 µm, especially of 10 to 100 µm.

In addition to the powder coating particles which are obtained as described above, other powder coatings may be used as well in the process according to the pre-sent invention, for example, those described in Pieter Gillis de Lange, Powder Coatings-Chemistry and Technology, 2nd edition, Vincentz Network, Hanover 2004.

It is possible to also include in the process according to the present invention both organic and inorganic powders as coating material which are basically non-meltable but which may be sintered at higher temperatures. For example, it is possible to coat glass by the process according to the present invention which is either conductive or has a conductive coating (such as, for example, ITO (indium tin oxide) glass), for example, with titanium dioxide nanoparticles described, for example, at www.nanophase.com. This coating can subsequently be sintered at higher temperatures (400-600° C.). Thus, the process according to the present invention can be used for the efficient production of solar cells on dye basis (see M. Graetzel, Nature, 353 (24), 737, 1991).

Using the process according to the present invention, particularly smooth surfaces can be obtained. One parameter for this is the so-called gloss value which can be determined with a glossmeter. The surfaces obtained by the process according to the present invention have in general a gloss value <60, preferably <30 and more preferably <20 (as measured with a glossmeter from Byk Gardner at 60°).

The invention is further illustrated by the following examples and comparative examples.

EXAMPLE 1

Preparation of the Powder Coating 380 parts of an epoxy resin (melting point 90-110° C., epoxy equivalent weight 400 g/eq), 116 parts of a solid epoxy resin (4.3-4.9 eq/kg), 160 parts filler (particle size <8 µm), 25 parts dicyano diamide (particle size <6 µm), 16 parts benzoin and 16 parts methyl imidazole and 12 parts of a flow improver (acrylic polymer) and 3 parts additives for the improvement of the adhesive strength are mixed in a premixer and then extruded (twin-screw extruder from OMC, Saronno, Italy, type EBVP 20/24; temperature 100° C., rotation momentum 65%). The subsequent milling is done in a mill from Fritsch (pulverisette 14, 15000 rpm). The oversize material is separated by sieving (<100 µm). 50% of the particles have a particle size <30 µm.

Application by a combination of EMB and boiling bed:

24 kg carrier particles consisting of a magnetic core (magnetite) coated with a silicone polymer layer are mixed with 4 kg of the powder coating and transferred to the EMB unit. The mixture of carrier particles/powder is fluidized by applying a pressure of 6 bar. The velocity of the brush drum is adjusted to 35% of the maximum velocity which is sufficient to provide a uniform coating. A 12 µm copper sheet (width 620 mm) is on the substrate drum which is operated at a velocity of 3 m/min. Fresh powder is continuously added from the outside (190 g/min). After applying a positive voltage to the brush drum, the powder particles are transferred to the copper. The powder is molten in a subsequent melting unit and partially cured (35% as determined by DSC). The sheet so produced has a gloss value <10 (measured with a glossmeter from Byk Gardner at 600).

COMPARATIVE EXAMPLE 1

The same powder coating as obtained in Example 1 was used. The coating was done such that an arrangement of mixing rolls instead of a fluidized bed was used to mix the carrier particles and powder particles and to transport them to the brush drum. All the other parameters are identical.

The table below shows the layer thickness of a copper sheet (width: 62 cm) at five different positions at a point where 8.5 m of the sheet have been coated.

|  | Position 1 | Position 2 | Position 3 | Position 4 | Position 5 | Maximum deviation |
|---|---|---|---|---|---|---|
| Example 1 | 61 µm | 62 µm | 61 µm | 64 µm | 58 µm | 10% |
| Comparative Example 1 | 67 µm | 81 µm | 72 µm | 71 µm | 57 µm | 42% |

LIST OF REFERENCE SIGNS (1): Brush drum
(2): Substrate drum
(3): Mixing drums
(4): Plate for the retransfer of the carrier particles
(5): Device for adjustment of the height of the brush
(6): Roll for reeling off the substrate
(7): Heating means
(8): Take-up roller for the coated substrate
(9): Container

What is claimed is:

1. A process for the mixing and gentle transport and the transfer of powders to substrates wherein the powder particles are first charged by friction in the presence of magnetic particles and then transported by means of a fluidized bed and optionally one or more mixing rolls to a brush drum and then electrostatically transferred and applied to a substrate by means of an electric field between the brush drum and a substrate drum carrying said substrate, wherein the mixing and the transport of the powder particles and the magnetic particles are carried out by means of the fluidized bed.

2. The process according to claim 1, characterized in that the substrate is a metal sheet or a metallized plastic sheet, a conductive plastic sheet, a conductive glass or a glass having a conductive coating.

3. The process according to claim 2, characterized in that the substrate is ITO (indium tin oxide) glass.

4. The process according to claim 1, characterized in that the substrate is a metal sheet which is in intimate contact with a fibre-reinforced woven fabric or mat.

5. The process according to claim 4, characterized in that the fibre-reinforced material is selected from the group consisting of glass fibre and high-performance fibres.

6. The process according to claim 5, characterized in that the high-performance fibres are aramide fibres, carbon fibres or ceramic fibres.

7. The process according to claim 1, characterized in that the powder coating particles are particles obtainable by
  (i) mixing
    a) a polymeric binder, an oxazene resin, a cyanate ester or a maleimide,
    b) a hardener or initiator,
    c) a paint additive,
    d) optionally a filling agent,
    e) optionally a compatibilizing polymer
    and optionally further components
  (ii) melt extrusion of the mixture obtained in step (i) above and
  (iii) milling and sieving the extruded mixture.

8. The process according to claim 1, characterized in that the size of the powder coating particles is <150 µm.

9. The process according to claim 1, characterized in that the size of the powder coating particles is <100 µm.

10. The process according to claim 1, characterized in that the size of the powder coating particles is <50 µm.

11. The process according to claim 1, characterized in that the size of the magnetic particles is 20-100 µm.

12. The process according to claim 1, characterized in that the powder coating has a layer thickness distribution of ±15%, preferably 10% and most preferably 5%.

13. The process according to claim 1, characterized in that the coated substrate has a gloss value <60 measured with a glossmeter from Byk Gardner at 60°.

14. The process according to claim 2, characterized in that the size of the powder coating particles is <150 µm.

15. The process according to claim 2, characterized in that the size of the powder coating particles is <100 µm.

16. The process according to claim 2, characterized in that the size of the powder coating particles is <50 µm.

17. The process according to claim 2, characterized in that the size of the magnetic particles is 20-100 µm.

* * * * *